United States Patent
Kwon (10) Patent No.: US 6,943,430 B2
(45) Date of Patent: Sep. 13, 2005

(54) SEMICONDUCTOR WAFER HAVING ELECTRICALLY CONNECTED PASSIVE DEVICE CHIPS, PASSIVE DEVICES AND SEMICONDUCTOR PACKAGE USING THE SAME

(75) Inventor: Heung Kyu Kwon, Seongnam (KR)

(73) Assignee: Samsung Electronics Co., LTD, Suwon-si (KR)

( * ) Notice: Subject to any disclaimer, the term of this patent is extended or adjusted under 35 U.S.C. 154(b) by 0 days.

(21) Appl. No.: 10/463,607

(22) Filed: Jun. 18, 2003

(65) Prior Publication Data

US 2004/0012081 A1 Jan. 22, 2004

(30) Foreign Application Priority Data

Jul. 19, 2002 (KR) .......................................... 2002-42538

(51) Int. Cl.⁷ .............................................. H01L 29/06
(52) U.S. Cl. ........................................ 257/620; 257/622
(58) Field of Search .................................. 257/620, 622, 257/678

(56) References Cited

U.S. PATENT DOCUMENTS 5,528,083 A    6/1996  Malladi et al. ............. 257/786
5,593,901 A  * 1/1997  Oswald et al. ................ 438/80

FOREIGN PATENT DOCUMENTS

| JP | 11-003969    | 1/1999  |
| JP | 11-260999    | 9/1999  |
| JP | 2001-102512  | 4/2001  |
| KR | 1999-0086685 | 12/1999 |
| KR | 2000-0008455 | 2/2000  |

* cited by examiner

*Primary Examiner*—Roy Potter
(74) *Attorney, Agent, or Firm*—Harness, Dickey & Pierce, P.L.C.

(57) ABSTRACT

A semiconductor wafer includes a plurality of passive device units, which are electrically connected across scribe lines. Passive device chips in the wafer that are adjacent to one another in a first direction are electrically connected in parallel, while passive device units adjacent to one another in a second direction are connected in series. By selecting a number of adjacent passive device units extending in the first and second direction, and separating the selected units from the wafer along the corresponding scribe lines, a passive device chip having a desired electrical characteristic (e.g., capacitance or resistance) can be obtained. Such passive device chips may be assembled in a semiconductor package where they are electrically connected to active devices.

23 Claims, 7 Drawing Sheets

SEMICONDUCTOR WAFER HAVING ELECTRICALLY CONNECTED PASSIVE DEVICE CHIPS, PASSIVE DEVICES AND SEMICONDUCTOR PACKAGE USING THE SAME

CROSS REFERENCE TO RELATED APPLICATIONS

This U.S. non-provisional application claims priority under 35 U.S.C. §119 to Korean Patent Application No. 2002-42538 filed Jul. 19, 2002, the contents of which are incorporated by reference.

BACKGROUND OF THE INVENTION

1. Field of the Invention

The present invention relates to semiconductor devices and, more particularly, to a semiconductor wafer used for manufacturing passive device chips.

2. Description of the Related Art

The recent trend toward smaller electronic products has created a demand for miniature, light-weight components provided for implementation in these products. Various methods have been employed to meet the demand of reducing the size of components. Such methods include implementing a plurality of individual devices in a single chip, e.g., a system-on-chip (SOC), or a method for including a plurality of individual devices in a package such as a system-inpackage (SIP).

The SIP technology arranges a plurality of semiconductor chips in the same package. In this aspect, a multi-chip module (MCM) is similar to the SIP. However, MCM technology typically mounts the semiconductor chips side-by-side while SIP technology mounts the semiconductor chips on top of one another in a stacked configuration.

Passive devices such as capacitors, resistors and inductors can be mounted on a system board to improve electrical characteristics of an active device and reduce the noise of the input signal. An active device tends to exhibit better characteristics as the passive devices are mounted closer to the active device.

Such passive devices are generally manufactured according to a wafer fabrication process. If the passive device is a capacitor, the capacitor is typically formed of a planar structure. For increased capacitance per unit chip area, the capacitor may alternatively be manufactured according to a trench process where a dielectric/insulating material is deposited within a trench formed in the semiconductor wafer.

If the passive device is a resistor, the resistor may be manufactured by an implantation process in which impurities are implanted within the semiconductor material of the wafer. This process may control a resistance value by changing the depth at which the impurities are implanted. As the depth of implantation is reduced, the resistance value increases.

Conventionally, a plurality of passive device chips designed to exhibit different passive characteristics are manufactured using one wafer. For example, the wafer is produced as an attached set of capacitor chips having different capacitance values, or resistor chips having different resistance values. Individual passive device chips are then cut apart from the other passive device chip. Accordingly, a separate and individualized manufacturing process must be performed to manufacture each passive device chip on the wafer according to the required electrical characteristic (e.g., capacitance or resistance) of the respective chip, thus increasing the manufacturing costs.

SUMMARY OF THE INVENTION

Exemplary embodiments of the present invention include a semiconductor wafer comprising multiple passive device units divided by a plurality of scribe lines. The scribe lines include electrical connections between adjacent passive device units.

In an exemplary embodiment, each passive device unit includes at least one pair of electrodes of opposite polarity. The scribe lines extend in a first and second direction with respect to the wafer. When two passive device units are adjacent to one another in the first direction, a scribe line electrically connects electrodes of like polarity between the passive device units, thereby the passive device units in parallel. When two passive device units are adjacent in the second direction, a scribe line electrically connects electrodes of opposite polarity between the passive device units, thus providing a series connection between these passive device units.

In an exemplary embodiment, a semiconductor wafer according to exemplary embodiments of the present invention may be used to manufacture a passive device chip. According to this exemplary embodiment, a passive device chip comprises a portion of the semiconductor wafer, which has been separated or cut apart from the rest of the semiconductor wafer, and which includes a plurality of adjacent passive device units.

In an exemplary embodiment of the present invention, a semiconductor package includes a passive device chip according to exemplary embodiments of the present invention, which is electrically connected to a semiconductor device mounted on a substrate.

Another exemplary embodiment of the present invention is directed to a method of manufacturing a passive device chip by forming a passive region on a semiconductor wafer; creating scribe lines running in a first and second direction to define a plurality of passive device units, where each passive device unit includes at least one set of electrodes of opposite polarity; electrically connecting electrodes of adjacent passive device units; and separating a chip from the semiconductor wafer, which includes a plurality of adjacent passive device units.

BRIEF DESCRIPTION OF THE DRAWINGS

Exemplary embodiments of the present invention will become readily apparent by the following detailed description, with reference to the accompanying drawings, in which like reference numerals designate like structural elements, and, in which.

DETAILED DESCRIPTION OF THE INVENTION

The present invention and exemplary embodiments thereof are more fully described below with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the drawings, the thickness of layers and regions are exaggerated for clarity. When a layer is referred to as being "on" another layer or substrate, the layer may be directly on the other layer or substrate, or intervening layers may also be present.

Figure 1:
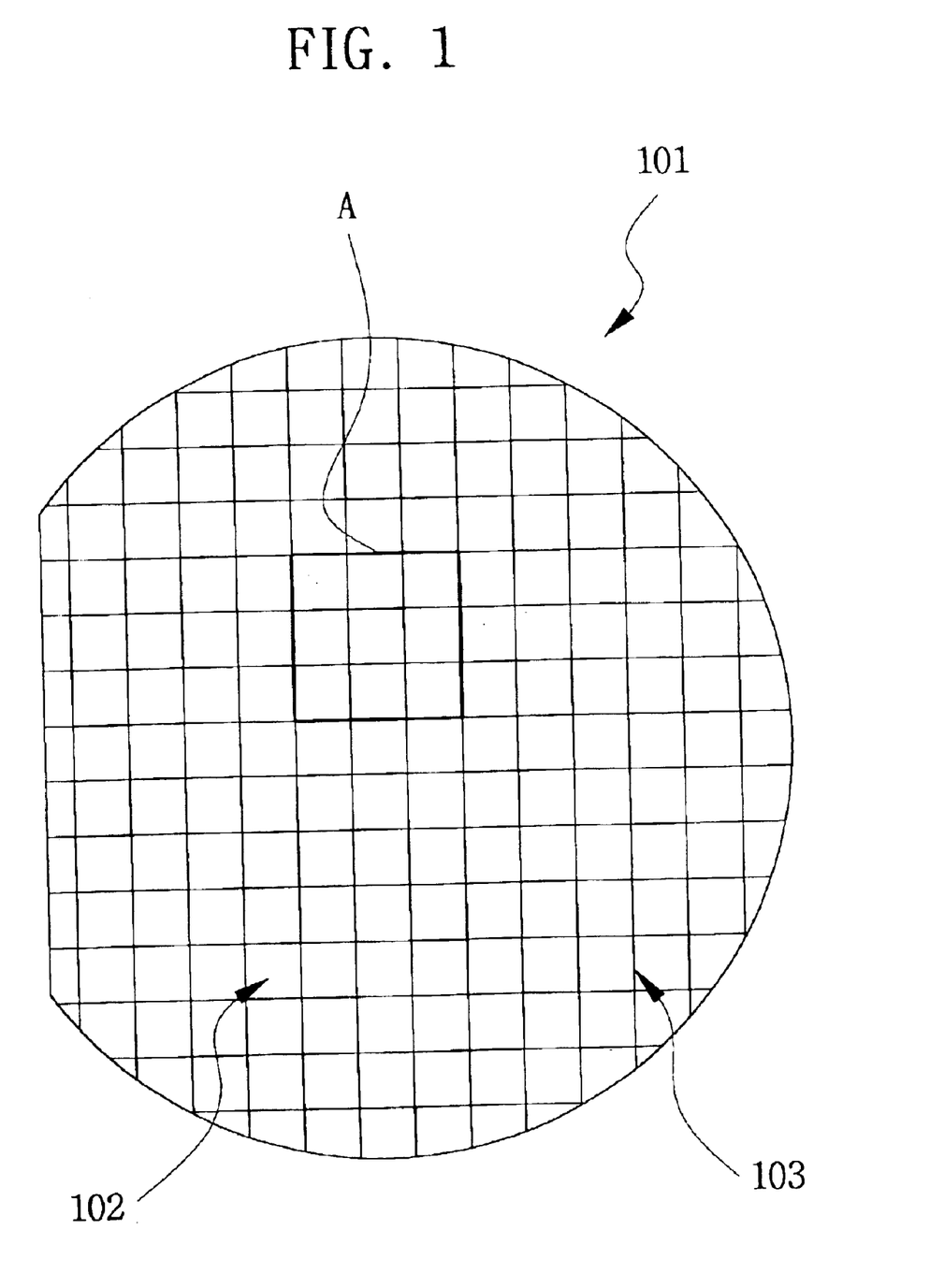
FIG. 1 illustrates a plan view of a wafer including passive device according to an exemplary embodiment of the present invention.

FIG. 1 illustrates a plan view of a wafer 101 including a plurality of passive device units 102 according to an exemplary embodiment of the present invention. The passive device units 102 may be manufactured in or on a silicon wafer 101 by a series of processes such as diffusion, photolithography, etching and thin film deposition.

According to an exemplary embodiment, the manufacture process may include generating a passive device region on the wafer 101 exhibiting a particular passive electrical characteristic (e.g., capacitance or inductance) and dividing the passive device region into the passive device units 102.

For example, to form passive device units 102 corresponding to capacitors, the passive device region may be formed on the wafer 101 by depositing a layer of dielectric or insulating material either on the wafer 101 or another conductive layer on the wafer 101, and then depositing a conductive layer of material on top of the dielectric/insulating layer. Scribe lines 103 may then be formed on the wafer 101 to divide the passive device region into a plurality of passive device units 102, as shown in FIG. 1. The scribe lines may be formed to extend in two directions, e.g., vertically and horizontally, with respect to the wafer 101.

In another example, if the passive device units 102 correspond to resistor components, the passive device region may be formed, e.g., by depositing a thin film metal on the wafer 101 or implanting impurities within the wafer 101.

It should be noted that the passive device region according to this exemplary embodiment could be formed using any other known method as will be readily apparent to those of ordinary skill in the art.

According to an exemplary embodiment, the scribe lines 103 may be formed so as to create passive device units 102 of substantially uniform size, thus allowing each unit 102 to exhibit substantially identical electrical characteristics. For instance, if the passive device units 102 are capacitor or resistor components, each unit 102 will have nearly the same capacitance or resistance, respectively.

The passive device units 102 of the wafer 101 can be separated, or cut apart, by sawing along the scribe lines 103. A conventional scribe line does not include any electrical components or circuitry. According to an exemplary embodiment, the scribe lines 103 of the present invention may include interconnection lines for connecting pairs of adjacent passive device units 102.

Figure 2:
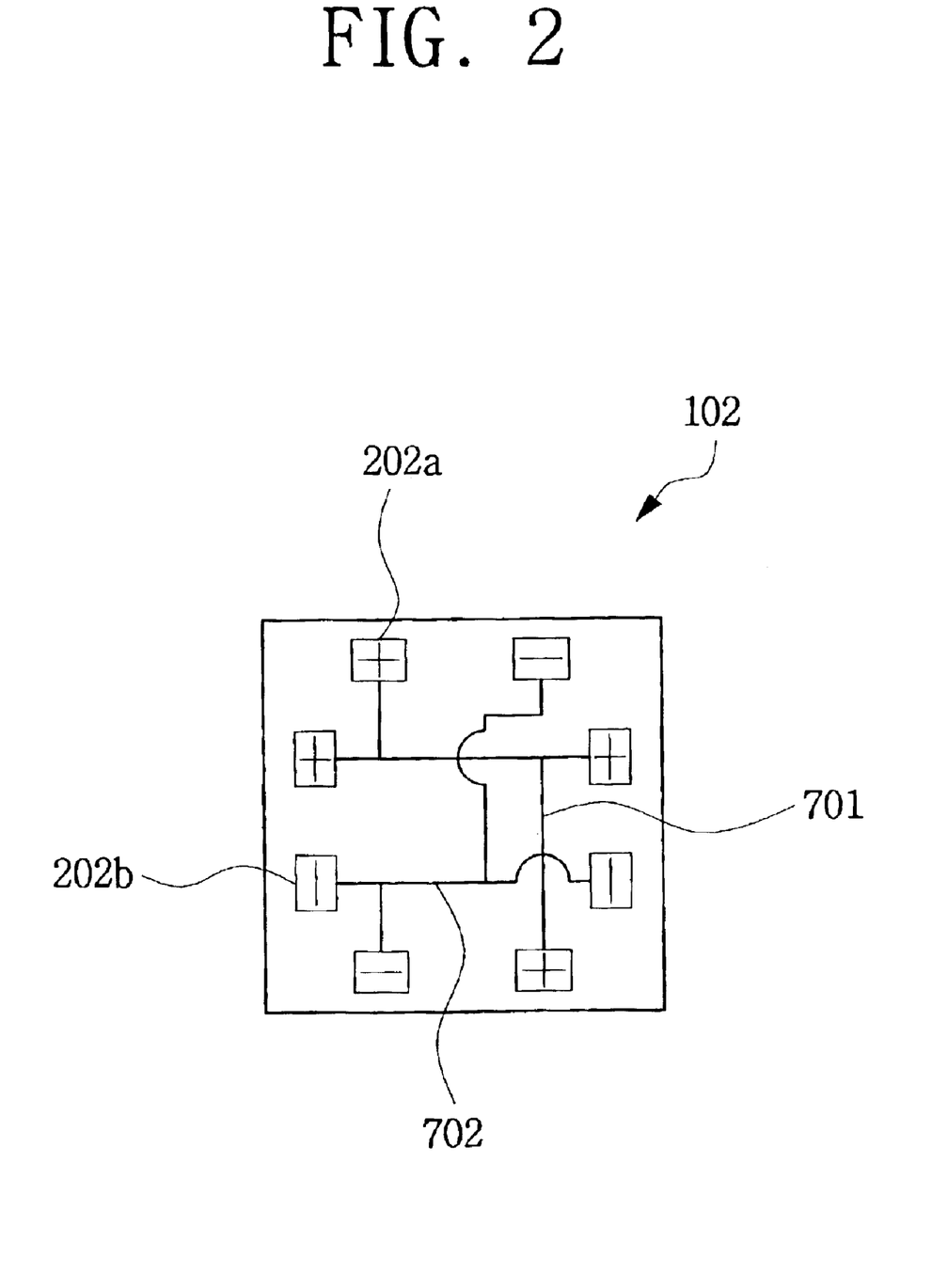
FIG. 2 illustrates a circuit-level view of the passive device unit shown in FIG. 1 according to an exemplary embodiment of the present invention.

FIG. 2 illustrates a circuit-level view of a passive device unit 102 shown in FIG. 1 according to an exemplary embodiment. In general, a passive device such as a resistor or a capacitor includes two at least electrodes with different, i.e., opposite, polarities. The passive device unit 102 of exemplary embodiments of the present invention may include several electrodes 202a and 202b, each having either a positive or negative polarity. Positive electrodes are identified by the sign '+' and negative electrodes are identified by the sign '−' in FIG. 2.

According to an exemplary embodiment, electrodes 202a and 202b are disposed at each edge of the passive device unit 102 to be electrically connected with electrodes of adjacent passive device units 102. Although the exemplary embodiment of FIG. 2 shows two electrodes formed at each edge, the prevent invention is not limited to two electrodes.

In an exemplary embodiment, each passive device unit 102 has four edges, including two pairs of opposing edges. For example, the device unit may have two pairs of opposing edges as shown in FIGS. 1 and 2. A first pair of edges may be defined by scribe lines 103 running in a first direction (e.g., running horizontally across the wafer 101), while a second pair of edges are defined by scribe lines 103 running in a second (vertical) direction. each edge of the passive device unit 102 may include at least two electrodes 202a and 202b of opposite polarity. As illustrated by the exemplary embodiment of FIG. 2, each edge of the pair of edges parallel to the horizontal direction (i.e., the upper and lower edges) has an opposite polarity configuration for its respective pair of electrodes 202a and 202b compared to the other edge. In other words, the pair of electrodes 202a and 202b of the upper edge has a positive-negative polarity configuration going left-to-right along the horizontal direction, while the lower edge has a negative-positive polarity configuration along the horizontal direction. In this exemplary embodiment, the other pair of opposing edges, which are parallel to the vertical direction (i.e., the left and right edges in FIG. 2) have matching-polarity configurations (positive-negative) for their respective pairs of electrodes 202a and 202b. The electrodes of the same polarity in the passive device 102 are electrically connected, e.g., the positive electrodes 202a are connected by an interconnection line 701 and the negative electrodes 202b are connected by an interconnection line 702 in FIG. 2.

Figure 3:
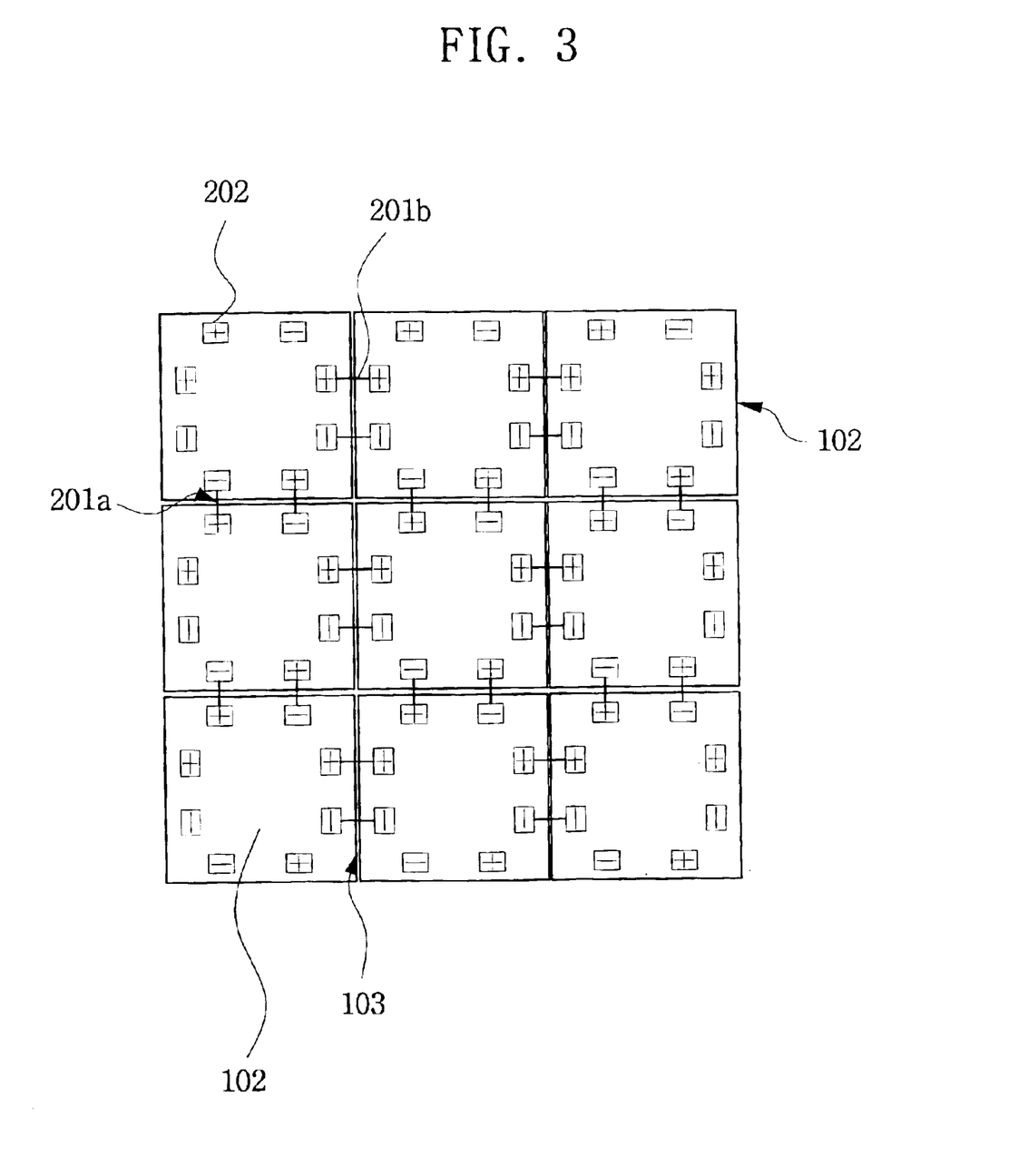
FIG. 3 illustrates a circuit-level view of section 'A' shown in FIG. 1 according to an exemplary embodiment of the present invention.

FIG. 3 illustrates a circuit-level view of section 'A' shown in FIG. 1 according to an exemplary embodiment of the present invention. Referring to FIG. 3, interconnection lines 201a and 201b are formed on the scribe lines 103 to electrically connect the electrodes 202 of adjacent passive device units 102. One set of interconnection lines 201a connects electrodes 202 of opposite polarity between passive device units 102, which are adjacent in one direction (i.e., vertical) to form a series connection between adjacent passive device units 102. The scribe lines 103 include interconnection lines 201b to electrically connect the electrodes 202 of the same polarity between passive device units 102, which are adjacent in the other direction (i.e., horizontal) to form a parallel connection between the adjacent passive device units 102.

Figure 4:
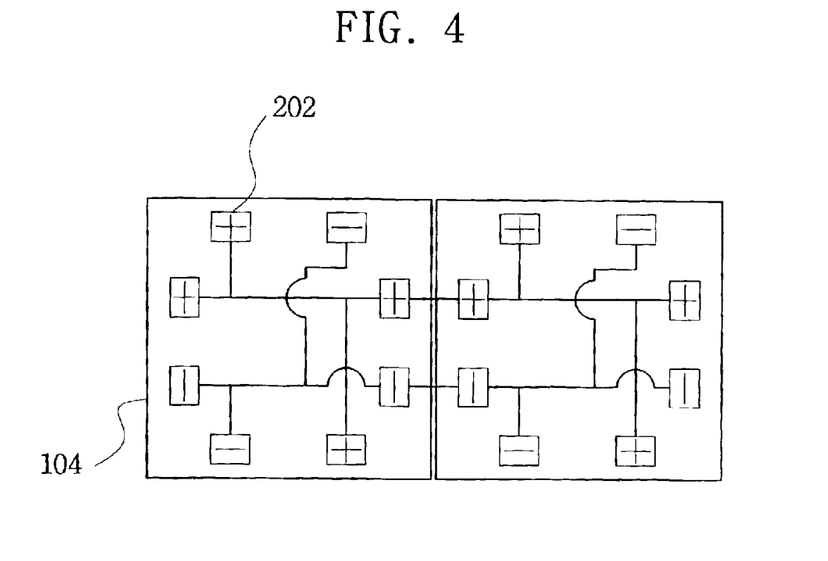
FIG. 4 is a plan view of a passive device chip comprising two passive device units connected in parallel according to an exemplary embodiment of the present invention.
Figure 5:
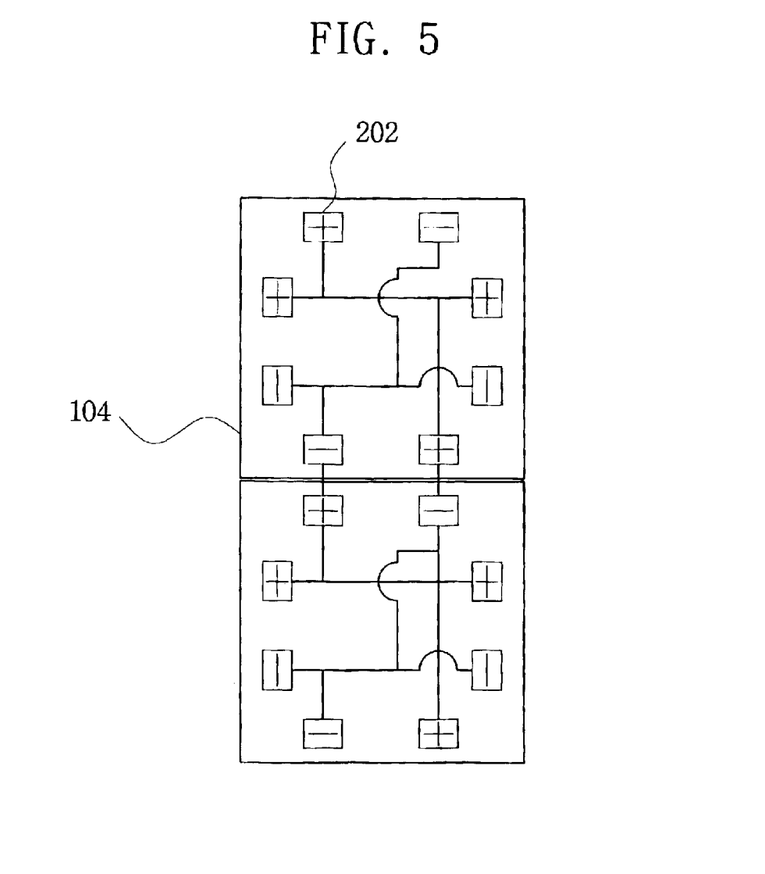
FIG. 5 illustrates a plan view of a passive device chip including two passive device units connected in series in accordance with another according to an embodiment of the present invention.

FIG. 4 illustrates a plan view of a passive device chip 104 comprising adjacent passive device units 102 connected in parallel according to an exemplary embodiment of the present invention. Such passive device chips 104 can be referred to as a parallel passive device chip. FIG. 5 illustrates a plan view of a passive device chip 104 comprising adjacent passive device units 102 connected in series according to an exemplary embodiment of the present invention. This type of passive device chip 104 can be referred to a series passive device chip.

Although FIG. 4 illustrates a parallel passive device chip 104 including only two passive device units 102 connected in parallel, such parallel passive device chips may include more than two units 102 connected in parallel. Similarly, while FIG. 5 illustrates only two passive device units 102 connected in series, a series passive device chip 104 may include more than two series connected passive device units 102.

Accordingly, in an exemplary embodiment where each passive device unit 102 is a resistor having resistance R, a series passive device chip 104 comprising n adjacent passive device units connected in series will have an associated resistance of n * R, and a parallel passive device chip 104 comprising n resistors connected in parallel will have an associated resistance R/n. In an exemplary embodiment where each of the passive device units 102 is a capacitor having capacitance C, a series passive device chip 104 comprising n adjacent passive device units 102 connected in series will have an associated capacitance C/n, and a parallel passive device chip 104 including n adjacent passive device units connected in parallel will have an associated capacitance of n * C.

Therefore, in exemplary embodiments of the present invention a passive device chip 104 of a desired electrical characteristic such as resistance or capacitance can be manufactured by selecting a number n of adjacent passive device units 102 extending either in a first or second direction (e.g., horizontally or vertically) in the semiconductor wafer 101. The portion of the wafer 101 including the selected passive device units is separated from the rest of the wafer 101 by cutting or sawing along the corresponding scribe lines 103 to generate the passive device chip 104. In an exemplary embodiment, a passive device chip 104 may be manufactured to include only one passive device unit 102, or more than one passive device units 102, depending on what electrical characteristic is required of the chip 104.

Although FIGS. 4 and 5 illustrate exemplary embodiments where a passive device chip 104 is formed either of adjacent passive device units 102 connected in parallel or in series, the present invention is not thus limited. For example, according to an exemplary embodiment, the passive device chip 104 may include both adjacent passive device units connected in series and adjacent passive device units connected in parallel to obtain a desired electrical characteristic. In other words, the portion separated from the wafer 101 may include at least one passive device unit 102, which is commonly adjacent two different passive device units in two different directions with respect to the wafer 101.

Figure 6A:
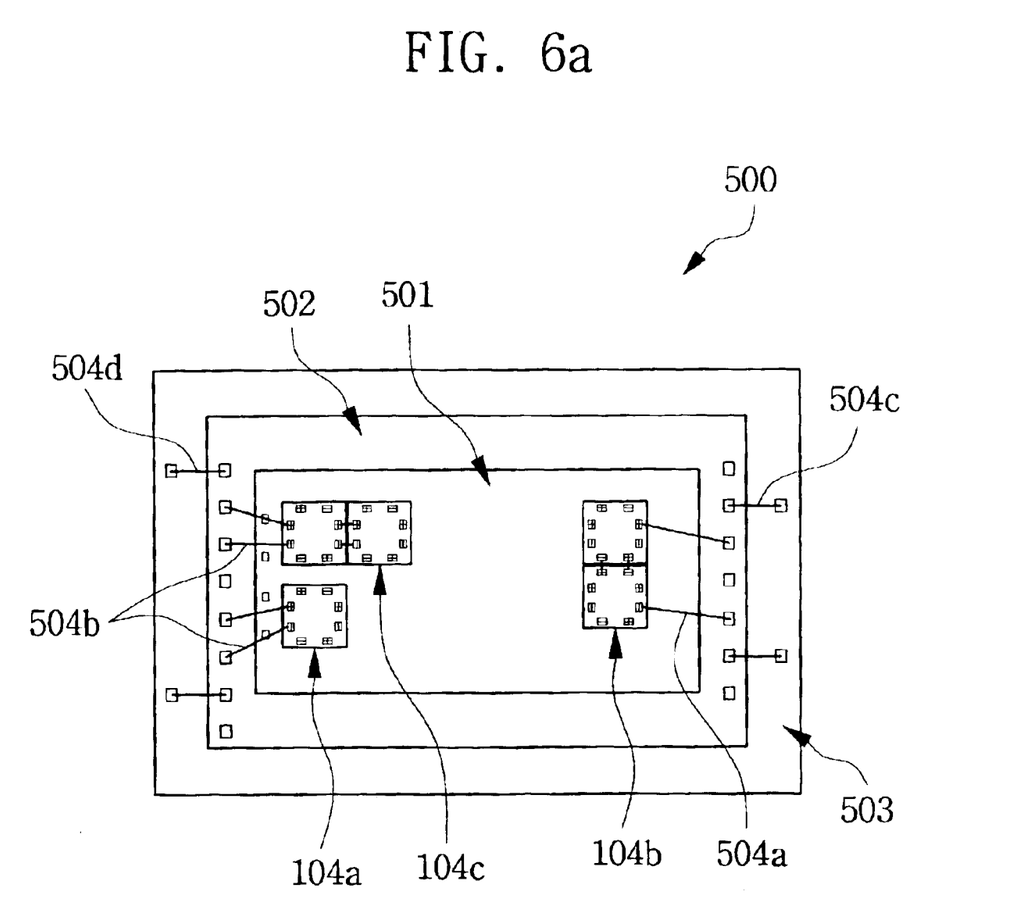
FIGS. 6a and 6b illustrate a plan view and a cross-sectional view, respectively, showing a semiconductor package having passive device chips with various electrical characteristics connected to active devices via wire bonding in accordance with an exemplary embodiment of the present invention.
Figure 6B:
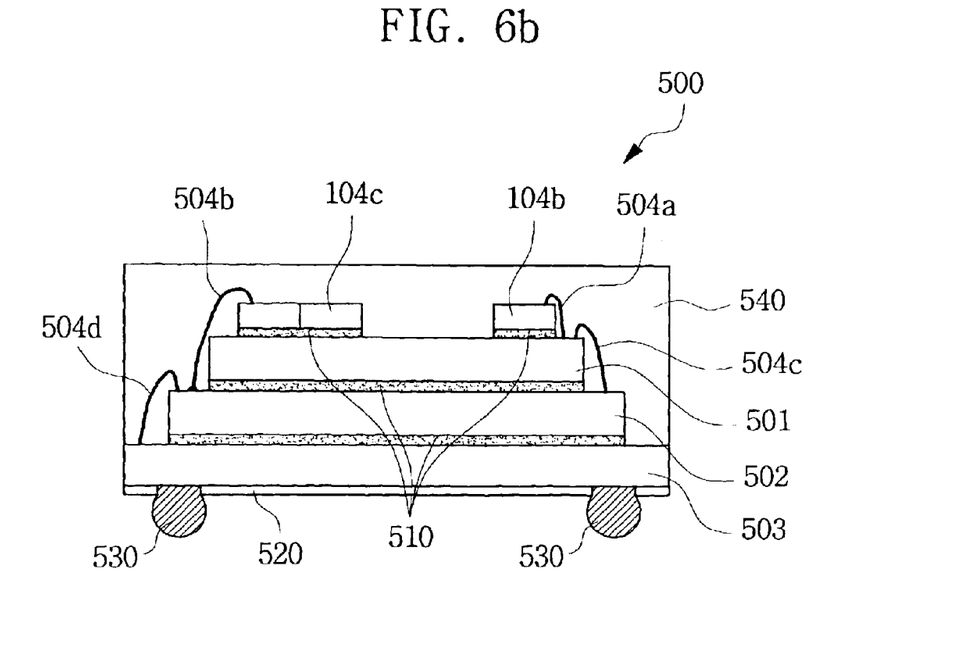

FIGS. 6a and 6b illustrate, in a plan view and a cross-sectional view, respectively, one example of a semiconductor package including passive device chips 104a–c with various electrical characteristics (e.g., capacitance or resistance) according to an exemplary embodiment of the present invention. The passive devices are electrically connected to active semiconductor devices 501 and 502, which may be, for instance, a memory chip and a central processing unit (CPU) chip, respectively.

Referring to the example of FIGS. 6a and 6b, a lower active chip 502 (e.g., CPU chip) may be attached on a substrate 503 by adhesive 510, and an upper active chip 501 (e.g., memory chip) is attached to the CPU chip 502 by adhesive 510. The passive device chips 104a, 104b, 104c are attached on the device 501 by adhesive 510. Passive device chip 104b is composed of two passive device units 102 connected in series, whereas passive device chip 102c is composed of two passive device units 102 connected in parallel. Passive device chip 104a is composed of a single passive device chip 102.

FIGS. 6a and 6b, an exemplary embodiment is shown where electrical connections between the passive device chips 104a–104c, the upper and lower active devices 501 and 502, and the substrate 503 comprise bonding wires 504a–504d. Series passive device chip 104b is electrically connected to the upper active chip 501 by bonding wires 504a, and passive device 102a and 102c is electrically connected to the lower chip 502 by bonding wires 504b. The upper and lower chips 501 and 502 are electrically connected to each other and to the substrate 503 by bonding wires 504c and 504d.

According to an exemplary embodiment, such electrical connections between the passive device chips 104a–104c and the active devices 501 and 502 may be made as follows. As to a parallel passive device chip such as 104c, the bonding wires 504b can start from one positive electrode and one negative electrode corresponding to any single passive device unit 102 (i.e., the connecting passive device unit 102). On the other hand, for a series passive device chip such as 104b, the bonding wires 504a should start from one positive electrode of one of the outermost passive device units 102 and one negative electrode of the other outermost passive device unit 102 of the passive device chip 104.

According to an exemplary embodiment, as shown in FIG. 6b, the substrate 503 of the semiconductor package 500 may include external terminals 530 such as metallic bumps or solder balls. The substrate 503 may also include a coating layer 520 such as a solder resistor layer formed on the bottom surface thereof to help the formation of the terminals 530. In an exemplary embodiment, the top surface of the substrate 503, as well as each of the passive device chips 104, the active devices (e.g., 501 and 502), and the other elements in the semiconductor package 500 may be encapsulated, i.e., protected by an encapsulant 540 such as a mold resin.

Figure 7:
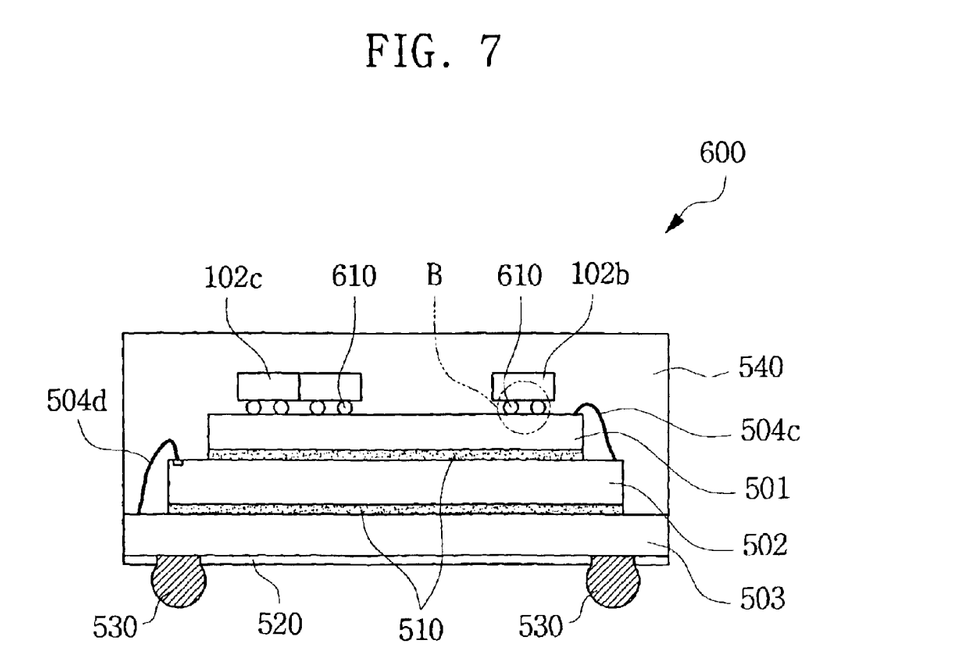
FIG. 7 illustrates a cross-sectional view of a semiconductor package including passive device chips electrically connected to active devices via flip-chip bonding according to an exemplary embodiment of the present invention.

According to another exemplary embodiment, the electrical connection between the passive device chips 104 and active semiconductor devices may be established by using a flip-chip bonding, as shown in FIG. 7. Flip-chip bonding may improve the electric characteristics associated with passive device chips 104 that are manufactured as inductor devices.

Figure 8:
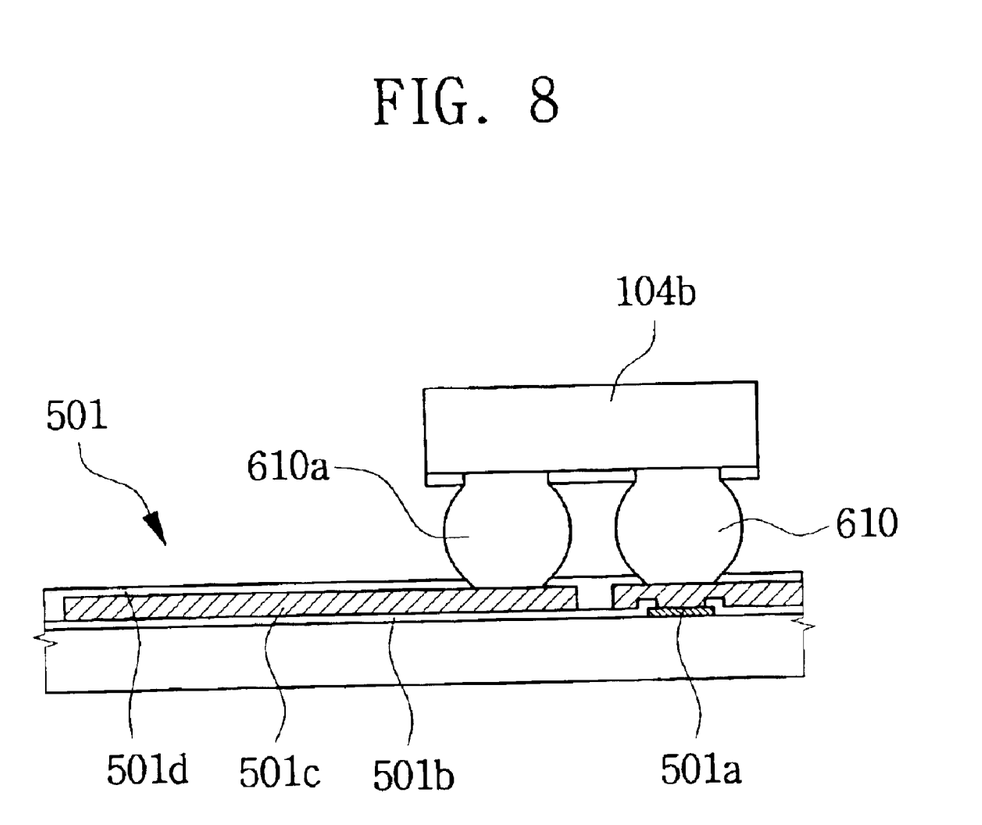
FIG. 8 illustrates a more detailed view of section 'B' shown in FIG. 7 according to an exemplary embodiment of the present invention.

FIG. 7 illustrates a cross-sectional view of a semiconductor package 600 including a series passive device chip 104b and a parallel passive device chip 104c, which are electrically connected to an active device via flip-chip bonding according to an exemplary embodiment of the present invention, and FIG. 8 is more detailed view of section 'B' shown in FIG. 7 according to an exemplary embodiment.

According to the exemplary embodiment to FIGS. 7 and 8, the passive devices 104b and 104c may be inverted, such that conductive bumps 610 face downward for flip-chip bonding. The passive devices 104b and 104c may be attached and electrically connected to an upper active device 501 through bumps 610.

As shown in greater detail in FIG. 8, the upper active device 501 used for flip-chip bonding may be a redistributed chip. In other words, the upper active device 501 may include a redistribution metal layer 501c formed on a passivation layer 501b. The redistribution layer 501c may be covered with a polymer layer 501d. The redistribution metal layer 501c electrically connects a power/ground pad 501a of the active device 501 with a corresponding bump 610 of the passive device chip 104b. The redistribution layer allows for a power/ground pad and a corresponding bump to be electrically connected even though they are not disposed at the same location. For example, in FIG. 8, one power/ground pad (not shown) of the active device 501 is electrically connected to the corresponding bump 610a by the redistribution layer 501c.

In addition, any type of under bump metal (UBM) as will be contemplated by those skilled in the art may be formed on interface between the redistribution metal layer 501c and the bumps 610 and 610a. The UBM may include Ni/Au(Ag), Ti/Ni/Au(Ag), Ti/Cu/Au(Ag), Cr/Cr—Cu/Cu/Au(Ag), TiW/Ni(V)/Au(Ag) or solder selectively consisting of Pb/Sn/Cu/In/Bi/Zn/Ag/Au.

Although exemplary embodiments have been described above with respect to attaching passive device chips 104 to active semiconductor devices in a semiconductor package using wire bonding and flip-chip bonding, the present invention is not limited to such bonding techniques. Exemplary embodiments of the present invention cover semiconductor packages using any and all bonding techniques as will be readily contemplated by those of ordinary skill in the art, to attach and/or electrically connect the passive device chip 104 to an active semiconductor device.

For example, such bonding techniques may include tape automated bonding (TAB), other types of bonding utilizing bumps formed on a passive device chip 104 while it is still in semiconductor wafer form. In addition, while the above exemplary embodiments describe that bonding bumps are formed on the passive device chips 104, exemplary embodiments of the present invention cover semiconductor packages utilizing other bonding techniques where, e.g., the bonding bumps are formed on the active devices rather than the passive device chips 104.

Further, although the exemplary embodiments above describe a semiconductor package including upper and lower active devices 501 and 502, the present invention is not thus limited. In an exemplary embodiment, the semiconductor package may include one or more passive device chips 104 electrically connected to a general semiconductor device, which includes any number of active devices arranged in any type of configuration, including stacked, side-by-side, or configurations in which the active devices are mounted on opposite sides of a substrate.

Although the above exemplary embodiments illustrate the passive device units 102 of a passive device chip 104 being connected on the same level, exemplary embodiments of the present invention cover all obvious variations. For example, in an exemplary embodiment, the passive device chip 104 may include more than one passive device unit 102, which are individually separated from the wafer 101 and thereafter arranged in a stacked configuration using any type semiconductor chip stacking method that will be contemplated by those of ordinary skill. In such an embodiment, the electrodes of the passive device units 102 may be connected as described in the exemplary embodiments above to provide series and/or parallel connections to achieve the desired electrical characteristics for the passive device chip 104.

According to exemplary embodiments of the present invention, a plurality of passive device units can be manufactured on a wafer using the same process. Parallel and series connections are provided at the wafer level between passive device units adjacent in a first and second direction, respectively. Thus, a passive device chip can be manufactured from the wafer to meet a desired electrical characteristic by selecting and separating a number of adjacent passive device units extending in the first and/or second direction. Thus, exemplary embodiments of the present invention reduces the time and costs involved in manufacturing passive device chips and improves productivity.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A semiconductor wafer comprising:
   a plurality of passive device units, each passive device unit including one or more pairs of electrodes of an opposite polarity;
   a plurality of scribe lines extending in a first and second direction, the scribe lines dividing each passive device unit from adjacent passive device units, the scribe lines including electrical connections between electrodes of a same polarity to connect passive device units adjacent in the first direction in parallel, the scribe lines including electrical connections between electrodes of opposite polarity to connect in series passive device units adjacent in the second direction.

2. The semiconductor wafer of claim 1, each passive device unit having a first pair of edges parallel to the first direction and a second pair of edges parallel to the second direction, each edge including a pair of electrodes of an opposite polarity, wherein the first pair of edges have opposite polarity configurations for their respective pairs of electrodes with respect to the first direction, and the second pair of edges have matching polarity configurations for their respective pairs of electrodes with respect to the second direction.

3. The semiconductor wafer of claim 1, wherein the electrodes of a same polarity within each passive device unit are electrically connected.

4. A passive device chip separated from the semiconductor wafer of claim 1, the passive device chip comprising at least two of the passive device units.

5. A semiconductor package comprising:
   a substrate;
   a semiconductor device attached to the substrate; and
   at least one passive device chip as recited in claim 4 electrically connected to the semiconductor device.

6. The semiconductor package of claim 5, wherein the at least one passive device chip is electrically connected to the semiconductor device by bonding wires.

7. The semiconductor package of claim 5, wherein:
   the at least one passive device chip includes a series passive device chip, each of the passive device units of the series passive device chip being connected in series to an adjacent passive device unit, the passive device units of the series passive device chip including first and second outermost passive device units, and the bonding wires include a positive bonding wire and a negative bonding wire, the positive bonding wire being electrically connected to the positive electrode of the first outermost passive device unit, the negative bonding wire being electrically connected to the negative electrode of the second outermost passive device unit.

8. The semiconductor package of claim 5, wherein:

the at least one passive device chip includes a parallel passive device chip, each of the passive device units of the parallel passive device chip being connected in parallel to an adjacent passive device unit, the passive device units of the parallel passive device chip including a connecting passive device unit, and the bonding wires include a positive bonding wire and a negative bonding wire electrically connected to a positive electrode and negative electrode, respectively, of the connecting passive device unit.

9. The semiconductor package of claim 5, wherein the at least one first passive device chip is electrically connected to the semiconductor device by bonding bumps.

10. The semiconductor package of claim 9, the at least one passive device chip including flip-chip bonding bumps, wherein the semiconductor device includes a redistribution metal layer electrically connecting at least one of power and ground pads of the semiconductor device with the flip-chip bonding bumps.

11. The semiconductor package of claim 7, the semiconductor device including the bonding bumps, wherein the at least one passive device chip includes a redistribution metal layer electrically connecting at least one of power and ground pads of the at least one passive device chip with the flip-chip bonding bumps.

12. The semiconductor package of claim 5, wherein the at least one passive device chip is electrically connected to the semiconductor device by tape-automated bonding.

13. The semiconductor package of claim 5, the semiconductor device including an upper active device and a lower active device formed as a stacked structure over the substrate.

14. The semiconductor package of claim 13, the at least one passive device chip including a first and second passive device chip, wherein the first semiconductor is mounted on and electrically connected to the lower active device, and the second passive device chip is mounted on and electrically connected to the upper active device.

15. A semiconductor wafer comprising:

a plurality of scribe lines, the scribe lines dividing a plurality of passive device units, the scribe lines including one or more electrical connections between the passive device units.

16. The semiconductor wafer of claim 15, wherein each electrical connection connects an electrode of a passive device unit to an electrode of an adjacent passive device unit.

17. The semiconductor wafer of claim 15, wherein the electrical connections include interconnection lines formed across the scribe lines.

18. The semiconductor wafer of claim 15, wherein each passive device unit includes one or more conductive layers formed over a semiconductor substrate, the conductive layers causing the passive device unit to exhibit at least one of a predetermined resistance and capacitance.

19. The semiconductor wafer of claim 15, the scribe lines defining a plurality of edges for each respective passive device unit, wherein the passive device unit includes a pair of electrodes of opposite polarity at each edge, each electrode being electrically connected to the other electrodes of a same polarity within the respective passive device unit.

20. The semiconductor wafer of claim 19, the plurality of edges including a first pair of edges defined by scribe lines running in a first direction and a second pair of edges defined by scribe lines running in a second direction, wherein each electrode of the adjacent edge is respectively connected to an electrode of the opposite polarity of an adjacent passive device chip if the adjacent edge is one of the first pair of edges, thereby forming a parallel connection with the other passive device chip, and each electrode of the adjacent edge is respectively connected to an electrode of the same polarity of the adjacent passive device chip if the adjacent edge is one of the second pair of edges, thereby forming a series connection with the other passive device chip.

21. The semiconductor wafer of claim 19, wherein the first pair of edges have opposite polarity configurations for their respective pairs of electrodes with respect to the first direction, and the second pair of edges have matching polarity configurations for their respective pairs electrodes with respect to the second direction.

22. A passive device chip separated from the semiconductor wafer of claim 15, the passive device chip comprising at least two of the passive device units.

23. A semiconductor package comprising:

a substrate;

a semiconductor device electrically connected to the substrate; and at least one passive device chip as recited in claim 22 electrically connected to the semiconductor device.

* * * * *